US005125984A

United States Patent [19]
Kruehler et al.

[11] Patent Number: 5,125,984
[45] Date of Patent: Jun. 30, 1992

[54] INDUCED JUNCTION CHALCOPYRITE SOLAR CELL

[75] Inventors: Wolfgang Kruehler, Unterhaching; Josef Grabmaier, Berg, both of Fed. Rep. of Germany

[73] Assignee: Siemens Aktiengesellschaft, Munich, Fed. Rep. of Germany

[21] Appl. No.: 660,400

[22] Filed: Feb. 25, 1991

[30] Foreign Application Priority Data

May 31, 1990 [DE] Fed. Rep. of Germany ....... 4017590

[51] Int. Cl.⁵ .................... H01L 31/06; H01L 31/032
[52] U.S. Cl. .................................. 136/255; 136/258; 136/265; 357/12; 357/30
[58] Field of Search ................ 136/255, 258 PC, 265; 357/12, 30 B, 30 J, 30 K, 59 D, 61

[56] References Cited

U.S. PATENT DOCUMENTS 4,253,881  3/1981  Hezel .................................. 136/256
4,891,325  1/1990  Hezel et al. ............................ 437/2

FOREIGN PATENT DOCUMENTS 3713957  11/1988  Fed. Rep. of Germany ...... 136/255

OTHER PUBLICATIONS

R. Hezel et al, *Conference Record, 20th IEEE Photovoltaic Specialists Conference* (1988), pp. 1560–1564.
Mitchell et al., "Single and Tandem Junction CuInSe₂ Cell and module Technology", *Conference Record, 20th IEEE Photovoltaic Specialists Conference*, pp. 1384–1389 (1988).
Hezel, "Statusreport 1990", *Photovoltaik*, pp. 2–4 (May 1990).

*Primary Examiner*—Aaron Weisstuch
*Attorney, Agent, or Firm*—Hill, Van Santen, Steadman & Simpson

[57] ABSTRACT

A new solar cell of a I-III-VI$_2$ semiconductor material that has an inversion layer is provided. The cell comprises a substrate having an electrically conductive, first electrode, a p-conductive, polycrystalline semiconductor layer of chalcopyrite material, a barrier layer composed of an electrically non-conductive material, a second electrode, and an antireflection layer. The antireflection layer has stationary, positive charges that induce a negatively charged inversion layer in the boundary surface region of the semiconductor layer relative to the barrier layer. The negatively charged inversion layer serves as an emitter for a space charge zone. In an embodiment the invention comprises a semiconductor layer of copper-indium-diselenide or copper-gallium-diselenide, a barrier layer of silicon dioxide, an anti-reflection layer of silicon nitride, and cesium chloride as the stationary charges.

14 Claims, 1 Drawing Sheet

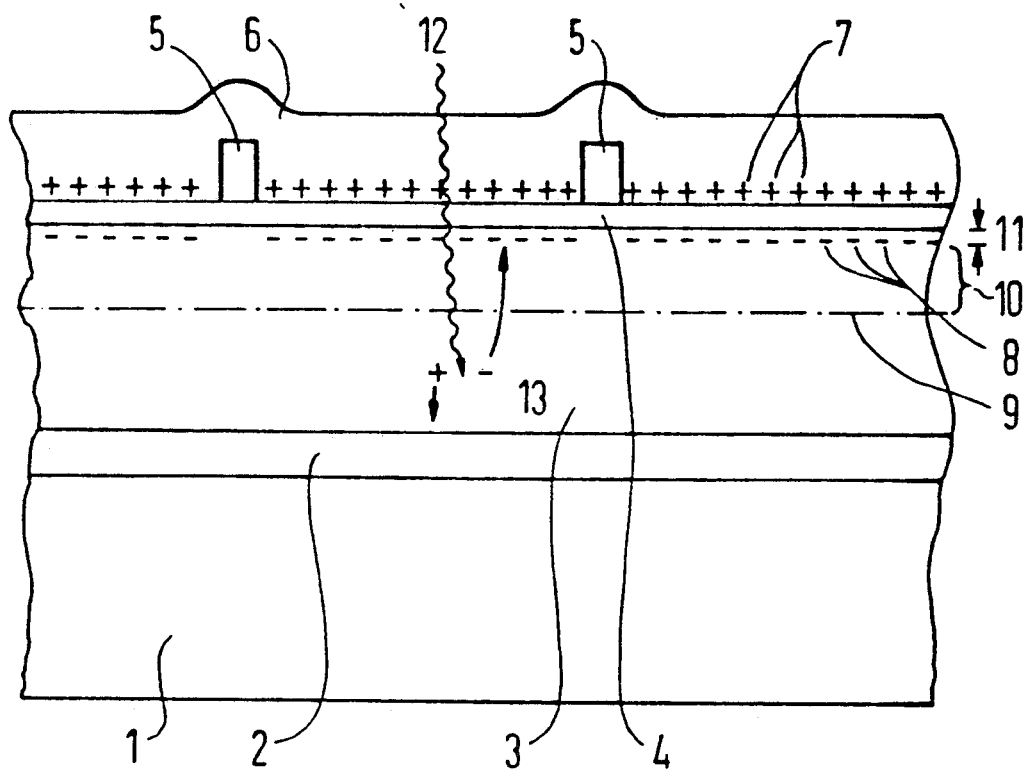

INDUCED JUNCTION CHALCOPYRITE SOLAR CELL

The present invention relates generally to solar cells.

In order to be competitive as an alternative to conventional energy generators, solar cells and photovoltaic solar modules for generating electrical power must be cost-beneficial. Further, they must have efficiencies of at least 15 percent.

Although solar cells constructed from crystalline silicon have high efficiencies, there is nonetheless an effort to switch to more cost-beneficial thin-film solar cells of amorphous or polycrystalline semiconductors. Such cells save material and eliminate costs. Whereas solar cells of amorphous semiconductor materials still do not provide sufficient efficiency and long-term stability, good results are currently achieved with thin-film solar cells of polycrystalline semiconductors.

Recently, solar cells of polycrystalline chalcopyrite material have been investigated. Probably the best-known representative of this class is copper-indium-diselenide (CIS). CIS is a direct semiconductor having a band gap of 1.0 eV. Based on the position of the band gap, a theoretical maximum efficiency of approximately 25 percent can be expected. Efficiencies of nearly 15 percent have been achieved with small-area test cells that have been manufactured.

An article by K. Mitchell et al. in *The Conference Record of the* 20th IEEE *Photovoltaic Specialists Conference* (1988), pages 1384 through 1389, discloses a CIS solar cell. The cell is composed of a glass substrate coated with molybdenum as a back side electrode, a polycrystalline, p-conductive CIS semiconductor layer as an absorber, a thin, n-conductive cadmium sulfide layer as an electron emitter, a zinc oxide layer as a transparent electrode, and an aluminum grid for receiving generated current.

One of the greatest problems in manufacturing CIS solar cells is matching the different crystal lattices or, respectively, the transition between the absorber and the emitter layer. The lattices should not differ by more than a maximum of 1 percent in order to still achieve acceptable efficiency; greater differences result in an increased number of defects in the band gap. This in turn results in recombination centers for the charge carriers and reduces the electrical power of such a solar cell. The stoichiometry of the CIS material, moreover, must be varied in the region of the pn-junction in order to achieve a "$p_+$-doping."

In addition to the problems encountered manufacturing a uniform layer composed of three constituents, other concerns are encountered. The use of toxic cadmium for the emitter layer provides a particular disadvantage for environmental reasons.

SUMMARY OF THE INVENTION

The present invention provides a chalcopyrite solar cell having high efficiency that overcomes the problems with respect to the lattice matching of the semiconductor materials used and does not use cadmium sulfide.

To this end, the present invention provides solar cells having a layer structure comprising the following, in succession on top of one another: a substrate having an electrically conductive, first electrode; a p-conductive, polycrystalline semiconductor layer of a I-III-VI$_2$ chalcopyrite material; a barrier (i.e. tunneling) layer of an electrically non-conductive material; an antireflection layer; and a second electrode for receiving generated current. The antireflection layer has stationary positive charges at least at the boundary surface to the barrier layer. The stationary, positive charges induce a negatively charged inversion layer in the boundary surface region of the semiconductor layer relative to the barrier layer. The negatively charged inversion layer serves as an emitter for a space charge zone.

In an embodiment, the semiconductor layer is a copper-indium-diselenide layer. In a further embodiment, indium can be replaced by gallium and selenium can be replaced by sulfur, independently of one another.

In an embodiment, the barrier layer is composed of amorphous silicon oxide and has a thickness of less than 5 nm.

In an embodiment, the antireflection layer is a silicon nitride layer.

In an embodiment, the antireflection layer is a silicon nitride plasma deposited from silane (SiH$_4$) and ammonia.

In an embodiment, the second electrode is a close-meshed metallic grid of, preferably, aluminum.

In an embodiment, the stationary, positive charges are formed by a plurality of layers of molecules of an ionic higher alkali metal halide. In a further embodiment, the higher alkali metal halide is cesium chloride.

The present invention provides, in an embodiment, a solar cell having the following layer structure: a molybdenum-coated glass substrate; a 1 through 2 μm thick polycrystalline layer of I-III-VI$_2$ chalcopyrite material; a barrier layer composed of amorphous silicon dioxide deposited in a maximum thickness of 2 nm; a close-meshed aluminum grid on the barrier layer; and a 50 through 200 nm thick, amorphous silicon nitride applied thereover that contains a plurality of layers of molecules of cesium chloride at least at the boundary surface to the barrier layer.

Additional features and advantages of the present invention are described in, and will be apparent from, the detailed description of the presently preferred embodiments and from the drawing.

BRIEF DESCRIPTION OF DRAWING

The Figure illustrates a schematic cross-sectional view of a solar cell of the present invention.

DETAILED DESCRIPTION OF THE PRESENTLY PREFERRED EMBODIMENTS

The present invention provides a solar cell having high efficiency, that overcomes the problems with respect to matching the lattices, and does not require the use of cadmium. To this end, the cell comprises a layer structure of: a substrate having an electrically conductive, first electrode; a p-conductive, polycrystalline semiconductor layer composed of a I-III-VI$_2$ chalcopyrite material; a barrier layer composed of an electrically non-conductive material; an anti-reflection layer; and a second electrode for receiving the generated current. The anti-reflection layer has stationary, positive charges at least at the boundary surface to the barrier layer that induce a negatively charged inversion layer in the boundary surface region of the semiconductor layer to the barrier layer. The inversion layer serves as an emitter for a space charge zone.

The solar cell of the present invention utilizes principles of an MIS inversion layer solar cell known in solar cells composed of crystalline silicon that may be derived, for example, from an article by R. Hezel in Status Report 1990, *Photovoltaik* 2-4 May 1990, pages 15-1 through 15-15. Whereas traditional, crystalline solar cells work like semiconductor diodes having a metallurgical pn-junction, the MIS inversion layer solar cell has an induced pn-junction, analogous to a MOS (metal oxide silicon) transistor.

The MIS inversion layer solar cell comprises a body of crystalline p-doped silicon as an absorber, a thin insulating layer of silicon oxide, and a cover layer of silicon nitride. The silicon nitride layer is enriched with positive charge carriers, for example heavy alkali metal ions, at the boundary surface to the silicon oxide layer. The positive charge carriers induce a negative charge in the boundary area region of the silicon layer at the other side of the silicon diode layer.

The enrichment of electrons in the actual p-conductive semiconductor material is called an inversion layer. This inversion layer, similar to a normal, n-conductive layer, can serve as an emitter for a space charge zone in the p-semiconductor that is depleted of charge carriers. An electrical field is created that corresponds to the charge condition of the corresponding semiconductor layers. The charge carriers are separated therein and thus generate an electrical current at the adjoining electrical contacts.

The present invention provides a CIS solar cell that does not require a pn-junction. This thereby avoids the problems associated with a lattice matching between the semiconductor layer and the emitter layer. An arbitrary barrier layer of an electrically insulating material can be directly generated on the chalcopyrite material semiconductor layer. The layer can be manufactured so that it is uniform and has few holes. For example, the invention provides a simple manner for producing the barrier layer from an insulating, amorphous oxide. No lattice matching is required as a result of this amorphous structure.

The anti-reflection layer is situated above the barrier layer. The anti-reflection layer functions, first, as a window layer for the incident solar radiation and also provides a matrix for the stationary, positive charges. In addition to comprising a high optical band spacing in order to ensure transparency, the anti-reflection layer has corresponding matrix properties and therefore must reliably bond with metal salts, preferably used for the stationary, positive charges in its structure.

In order to be able to better collect minority charge carriers (electrons) that are moving in the region of the positive CIS region, the second electrode can be directly located on the barrier layer. To this end, the second electrode is preferably structured so as to be of an optimally fine mesh. For example, the second electrode has a mesh spacing of approximately 200 to about 300 $\mu$m and a diameter of approximately 20 to about 30 $\mu$m.

The semiconductor layer can be, for example, composed of copper-indium-diselenide. Pursuant to the present invention, indium can be replaced by gallium and selenium can be replaced by sulfur, independently of one another.

It has been found, that compared to other CIS material, the use of gallium instead of indium has the advantage that the raw materials required therefor are more readily available. Replacing selenium with sulfur can yield further advantages with respect to the environmental concerns of the solar cell or, respectively, the method used for the manufacture thereof. This can be achieved without a great loss of power.

The thickness of the semiconductor layer is selected such that the incident light is completely absorbed. To this end, it has been found that a layer thickness of approximately 1 to about 2 $\mu$m is adequate.

Preferably, the barrier layer has a thickness of less than 5 nm and is fabricated as thinly as possible. Amorphous silicon oxide $SiO_x$ (wherein x is less than or equal to 2) has been found to be well-suited for this purpose. $SiO_x$ a can be uniformly deposited in a layer thickness of a maximum of 2 nm with available processes such as a low-pressure glow discharge in an atmosphere containing silane ($SiH_4$) and oxygen. It should be noted that other electrically insulating materials, however, are also fundamentally suitable insofar as they can be produced so as to be uniform, amorphous and thin.

As previously stated, the second electrode is applied directly on the barrier layer. For example, the second electrode can be applied by vapor-deposition of a thin and close-meshed metallic grid (of, for example, aluminum) through an appropriate mask.

The stationary charges are then applied thereover. Particularly, the charges are applied in the region of the surface of the barrier layer that is exposed in the open spaces of the electrode grid. The coating process can proceed by spraying, or with a spin-on technique. In this regard, an alkali metal halide, preferably cesium chloride, is particularly used.

The anti-reflection layer is produced directly on this layer, which only has a thickness of a few layers of atoms. The anti-reflection layer is likewise amorphous and is preferably generated in the same glow discharge reactor. For example, this layer can be generated by decomposition of silane and ammonia, whereby a silicon nitride layer ($Si_3N_4$) that is approximately 100 nm thick is generated. During the coating, the cesium ions diffuse into the silicon nitride layer to a depth of a few Angstroms where they are fixed.

The positive, stationary space charges of the silicon nitride/cesium layer induce negative charges in the upper region of the semiconductor layer across the thin barrier layer (tunnel oxide). The electron enrichment denotes an inversion of the original p-conduction into an n-conduction in this region. This inversion layer is approximately 30 nm thick. The inversion layer can function as the n-emitter for generating a space charge zone in the semiconductor layer.

The substrate can be any arbitrary material that, given inadequate electrical conductivity, is coated with the first electrode. Preferably, for cost purposes, a molybdenum-coated glass plate is used for this purpose. With respect to the adhesion of the semiconductor layer on the first electrode or, respectively, of the electrode on the glass, no problems are created with this construction; this is not necessarily true for other combinations of substrates and electrodes.

Referring now to the Figure, a schematic cross section through a solar cell of the present invention is illustrated. The actual size of components is not shown true-to-scale in order to provide a clearer illustration. By way of example and not limitation, an example of a solar cell of the present invention will be set forth.

A 1 mm thick glass plate serves as a substrate 1 on which a 2 $\mu$m thick molybdenum layer is applied as a first electrode. A polycrystalline, p-conductive CIS layer is applied thereon as a semiconductor layer 3, through known methods. For example, the layer can be applied by the simultaneous evaporation of copper, indium, and selenium from separate crucibles. Other known methods for producing the CIS semiconductor layer 3 can include electroplating, pyrolytic deposition, vapor-deposition or sputtering of copper and indium layers in succession and subsequent selenization in a $H_2Se$ atmosphere, or vapor-deposition of copper layers, indium layers and selenium layers in succession and subsequent tempering.

An approximately 2 nm thick amorphous $SiO_x$ layer 4 is deposited (wherein $x \leq 2$) over the semiconductor layer 3 through a low-temperature glow discharge process in which silane ($SiH_4$) and oxygen are decomposed. A thin and close-meshed grid 5 is applied on the barrier layer 4 as a second electrode by vapor-deposition of aluminum through an appropriate mask. The diameter and spacings of the individual meshes of the grid 5 are thereby selected so as to be optimally small for example 20 $\mu$m wide with a spacing of 200 $\mu$m.

Stationary, positive charges (cesium ions) are applied in a thin layer including a plurality of layers of molecules on surface 4, 5 by spraying cesium chloride. An approximately 100 nm thick silicon nitride layer ($Si_3N_4$) that functions as the anti-reflection layer 6 is produced thereover in a further glow discharge process by decomposition of silane and ammonia. During the coating process, the cesium ions diffuse into the silicon nitride layer a few Angstroms deep, where they are then fixed. In the Figure, these positive charges are illustrated by plus signs and are provided with the reference numeral 7.

At the other side of the barrier layer 4, the positive charges 7 now produce corresponding, negative charges 8 in the uppermost layer region 11 of the semiconductor layer 3. The negative charges 8 in the originally p-conductive semiconductor layer 3 form the inversion layer 11 that serves as an emitter for building up a space charge zone 10. This zone arises under the inversion layer 11 and extends, for example, up to the broken line indicated with reference numeral 9.

For operating the solar cell of the present invention, the anti-reflection layer 6 is irradiated. The material (silicon nitride) thereof, similar to the silicon dioxide of the barrier layer 4, is transparent to sunlight due to its high band gap. An incident light quantum 12 is therefore not absorbed until it reaches the semiconductor layer 3, where it generates a charge carrier pair 13. The charge carriers 13 are separated in the field of the space charge zone 10, that corresponds to the field adjacent to the barrier layer 4, and are ultimately carried off to the electrodes 2 and 5, respectively. The electrons can thereby tunnel through the thin barrier layer 11.

A further grid (not illustrated in the figure) is located on the surface of the anti-reflection layer 6, and functions to conduct the current initially collected in the grid 5 off.

Although the electrical wiring of the solar cell of the invention to form a module is also not illustrated, this can be constructed in accordance with known methods for thin-film solar cells.

The manufacturing method of the present invention has the advantage that all the steps can be implemented at a low-temperature in the range of $\leq 500°$ C.

Although the present invention provides a CIS solar cell, it can also be analogously used for other chalcopyrite solar cells of CuIn (Ga) $Se_2 (S_2)$.

It should be understood that various changes and modifications to the presently preferred embodiments described herein will be apparent to those skilled in the art. Such changes and modifications can be made without departing from the spirit and scope of the present invention and without diminishing its attendant advantages. It is therefore intended that such changes and modifications be covered by the appended claims.

We claim as our invention:

1. A solar cell having a layer structure comprising the following structure, in succession, on top of one another:
   a substrate having an electrically conductive, first electrode;
   a p-conductive, polycrystalline semiconductor layer of a $I-III-VI_2$ chalcopyrite material;
   a barrier layer of an electrically non-conductive material;
   a discontinuous second electrode for receiving generated current; and
   an antireflection layer having stationary positive charges at least at its boundary surface to the barrier layer, wherein the stationary positive charges induce a negatively charged inversion layer in the boundary surface region of the semiconductor layer relative to the barrier layer, whereby the negatively charged inversion layer functions as an emitter for a space charge zone in the semiconductor layer.

2. The solar cell of claim 1 wherein the semiconductor layer is a copper-indium-diselenide layer.

3. The solar cell of claim 1 wherein the semiconductor layer is a copper-gallium-diselenide layer.

4. The solar cell of claim 1 wherein the semiconductor layer is a copper-indium-disulfide layer.

5. The solar cell of claim 1 wherein the semiconductor layer is a copper-gallium-disulfide layer.

6. The solar cell of claim 1 wherein the barrier layer is composed of amorphous silicon oxide and has a thickness of less than 5 nm.

7. The solar cell of claim 1 wherein the antireflection layer is a silicon nitride layer.

8. The solar cell of claim 1 wherein the antireflection layer is a plasma nitride deposited from silane ($SiH_4$) and ammonia.

9. The solar cell of claim 1 wherein the second electrode is a close-meshed metallic grid.

10. The solar cell of claim 9 wherein the metallic grid is composed of aluminum.

11. The solar cell of claim 1 wherein the stationary positive charges are formed by a plurality of layers of molecules of an ionic, higher alkali metal halide.

12. The solar cell of claim 1 wherein the stationary positive charges are formed by a plurality of layers of cesium chloride molecules.

13. A solar cell comprising, in sequence, the following layer structure:
   a molybdenum-coated glass substrate;
   a polycrystalline p-conductive layer of $I-III-VI_2$ chalcopyrite material having a thickness of approximately 1 to about 2 $\mu$m on said substrate;
   a barrier layer composed of amorphous silicon dioxide deposited at a maximum thickness of approximately 2 nm;
   a close-meshed aluminum grid on the barrier layer; and
   an amorphous silicon nitride applied on the barrier layer at a thickness of approximately 50 to about 200 nm and containing a plurality of layers of molecules of cesium chloride at least at its boundary surface to the barrier layer.

14. A solar cell having a layer structure comprising, in sequence, the following layer structure:
- a substrate having an electrically conductive, first electrode;
- a p-conductive, polycrystalline semiconductor layer chosen from the group consisting of copper-indium-diselenide, copper-gallium-diselenide, copper-indium-disulfide, and copper-gallium-disulfide;
- a barrier layer of an electrically non-conductive material;
- a discontinuous second electrode for receiving generated current; and
- an antireflection layer having stationary positive charges at least at its boundary surface to the barrier layer, wherein the stationary positive charges induce a negatively charged inversion layer in the boundary surface region of the semiconductor layer relative to the barrier layer, whereby the negatively charged inversion layer functions as an emitter for the space charge zone in the semiconductor layer.

* * * * *